United States Patent
King et al.

(10) Patent No.: US 6,232,213 B1
(45) Date of Patent: May 15, 2001

(54) METHOD OF MAKING A SEMICONDUCTOR CHIP PACKAGE

(75) Inventors: Jerrold L. King, Boise; Jerry M. Brooks, Caldwell, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/910,500

(22) Filed: Aug. 4, 1997

Related U.S. Application Data

(63) Continuation of application No. 08/436,522, filed on May 8, 1995, now Pat. No. 5,677,566.

(51) Int. Cl.⁷ ............................................. H01L 21/44
(52) U.S. Cl. .................................... 438/613; 438/108
(58) Field of Search ............................ 257/666, 692, 257/738, 778, 787; 438/26, 64, 106, 108, 613, 107

(56) References Cited

U.S. PATENT DOCUMENTS

| | | | |
|---|---|---|---|
| 5,136,366 | 8/1992 | Worp et al. | 357/72 |
| 5,139,969 * | 8/1992 | Mori | 438/613 |
| 5,239,198 | 8/1993 | Lin et al. | 257/693 |
| 5,289,346 | 2/1994 | Carey et al. | 361/777 |
| 5,293,072 | 3/1994 | Tsuji | 257/787 |
| 5,341,564 | 8/1994 | Arhavain et al. | 28/832 |
| 5,355,283 | 10/1994 | Marrs et al. | 361/760 |
| 5,362,679 | 11/1994 | Wakefield | 437/206 |
| 5,397,921 | 3/1995 | Karnezos | 257/779 |
| 5,420,460 * | 5/1995 | Massingill | 257/778 |
| 5,442,231 | 8/1995 | Miyamoto et al. | 257/666 |
| 5,442,233 | 8/1995 | Anjoh et al. | 257/666 |
| 5,519,251 | 5/1996 | Sato et al. | 257/778 |
| 5,804,468 * | 9/1998 | Tsuji et al. | 438/613 |

FOREIGN PATENT DOCUMENTS 4-277636   10/1992   (JP) .

OTHER PUBLICATIONS

"Moto gets 'Slice' with packaging", Feb. 28, 1994, Electronic Engineering Times, pp. ?, 100.
"Mitsubishi Scales Down IC Packages", Electronic Engineering Times, Aug. 22, 1994, p. 13.
TA 8.2: A 34 ns 256 Mb DRAM with Boosted Sense-–Ground Scheme, 1994 IEEE International Solid–State Circuits Conference Digest of Technical Papers, pp. 140–141.
"Scandia Shrinks Size of BGA Packages", May 16, 1994, Electronic Engineering Times, p. 57.
Shinko Technology Update, Dec. 12, 1994, p. 141.

* cited by examiner

Primary Examiner—Roy Potter
(74) Attorney, Agent, or Firm—Ormiston & McKinney, PLLC

(57) ABSTRACT

A semiconductor chip package that includes discrete conductive leads in electrical contact with bond pads on a semiconductor chip. This chip/lead assembly is encapsulated within an encapsulating material and electrode bumps are formed through the encapsulating material to contact the conductive leads. The electrode bumps protrude from the encapsulating material for connection to an external circuit.

8 Claims, 3 Drawing Sheets

METHOD OF MAKING A SEMICONDUCTOR CHIP PACKAGE

CROSS REFERENCE TO RELATED APPLICATION

This is a continuation of Application Ser. No. 08/436,522 filed May 8, 1995 now Pat. No. 5,677,566.

FIELD OF THE INVENTION

This invention relates generally to semiconductor chip packages and, more particularly, to a molded semiconductor chip package having external electrode bumps connected to discrete conductive leads that are in electrical contact with the bond pads on the chip.

BACKGROUND OF THE INVENTION

In response to the demand for semiconductor chip packages having high lead counts and small footprints, ball grid array (BGA), "flip chip" and, more recently, "chip scale" packages have been developed. These packages are surface mounted to an external printed circuit board using an array of solder balls or similar electrode bumps, instead of metal leads. A BGA package utilizes a printed circuit board type substrate instead of a lead frame. In a typical BGA package, the semiconductor chip is mounted to the top surface of a substrate. The chip is wire bonded to electrical traces in the substrate. The chip is then overmolded with an encapsulating material. Solder balls are bonded to the electrical traces in the bottom surface of the substrate. The solder balls serve as the external electrodes for surface mounting on a printed circuit board.

Flip chip packages are similar to BGA packages, except that the solder balls are attached directly to the bond pads or electrical traces formed in the surface of the chip resulting in a more compact package. Due to the absence of an encapsulating material, flip chip packages are quite fragile and require careful assembly and handling techniques. Chip scale packages are being developed to combine the durability of the BGA packages and the small size of the flip chip packages. In a chip scale package, solder balls are attached to electrical traces in the surface of the chip or directly to the bond pads through openings in the encapsulating material. The electrical traces connect the solder balls, which form external electrodes bumps, to the bond pads in the chip. The chip scale package need only be slightly larger then the bare chip because the electrode bumps are formed on the surface of the chip.

It is desirable that the new smaller semiconductor chip packages be adapted for use in standard formats developed for larger chips. However, for both the flip chip and chip scale packages, in which the electrode bumps are attached directly to contacts on the surface of the chip, the electrode bump array must be reconfigured each time the chip is made smaller. Hence, the corresponding contacts on the printed circuit board to which the package is ultimately assembled (the chip "footprint"), must also be reconfigured. In addition, there remains a need for a semiconductor chip package that combines the small size of chip scale packages with the durability and economies of conventional lead frame assemblies and encapsulating techniques currently used to form molded plastic packages.

SUMMARY OF THE INVENTION

It is one object of the present invention to combine the small size of chip scale type packages with the durability and economies of conventional lead frame assemblies and encapsulating techniques.

It is another object of the invention to utilize an array of bump electrodes configured independent of the size of the semiconductor chip so that the package is compatible for use with standard formats developed for larger chips.

These and other objects and advantages are achieved by a semiconductor chip package that includes discrete conductive leads in electrical contact with bond pads on a semiconductor chip. This chip assembly is encapsulated within an encapsulating material such as a thermosetting epoxy resin. Electrode bumps are formed through openings in the encapsulating material to contact the conductive leads. The electrode bumps protrude from the encapsulating material for connection to an external circuit.

In one preferred embodiment of the invention, the package comprises a semiconductor chip having bond pads disposed thereon, the bond pads being accessible from an upper surface of the chip. Conductive leads, which extend over and are attached to the upper surface of the chip, are electrically connected to the bond pads. An encapsulating material covers at least a portion of the upper surface of the chip, the bond pads, and the leads. If desired, the entire assembly may be fully encapsulated. Alternatively, the conductive leads may extend out from the encapsulating material. Openings are formed in the encapsulating material to expose portions of the leads. Electrodes are formed through the openings in the encapsulating material and bonded to the exposed portions of the leads. These electrodes, typically solder balls, can then be surface mounted to a printed circuit board in the same way BGA and chip scale packages are mounted.

The conductive leads may be part of a conventional lead frame and the assembly encapsulated using equipment and techniques currently used to form molded plastic packages. The ends of the leads may extend out of the encapsulating material with or without forming to facilitate testing and burn-in. After testing, the leads may be severed flush with the encapsulating material or left extending from the package. Alternatively, the leads may be severed prior to encapsulation and the assembly fully encapsulated.

As noted, the semiconductor chip package of the present invention can be assembled using conventional molded plastic packaging techniques, equipment and materials. Further, because the electrode bumps are not connected directly to the bond pads or electrical traces in the semiconductor chip, the size of the package and the configuration of the electrode bump array can remain the same even as the chip is made smaller, thus allowing the package to be constructed to a standard format.

The figures are not meant to be actual views of the various embodiments, but merely idealized representations used to depict the structure and manufacture of the invention.

DETAILED DESCRIPTION OF THE INVENTION

Figure 1:
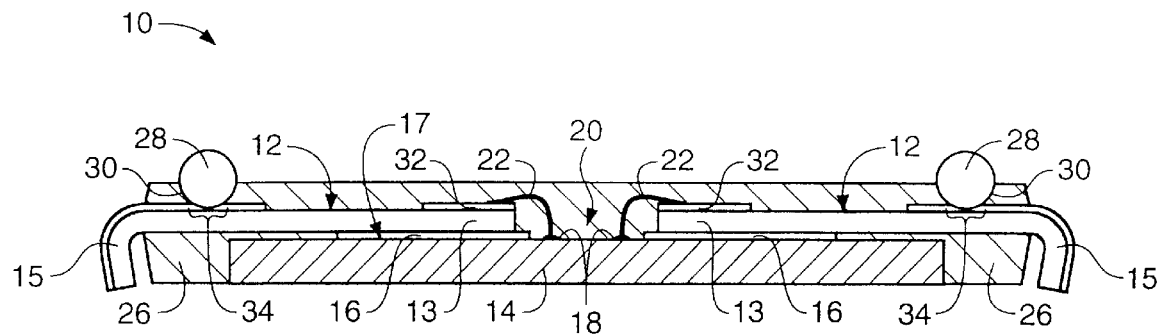
FIG. 1 is a cross section view of one embodiment of the invention wherein the encapsulating material covers the upper surface of the semiconductor chip and the conductive leads are positioned over the chip and extend outside the encapsulating material.
Figure 4:
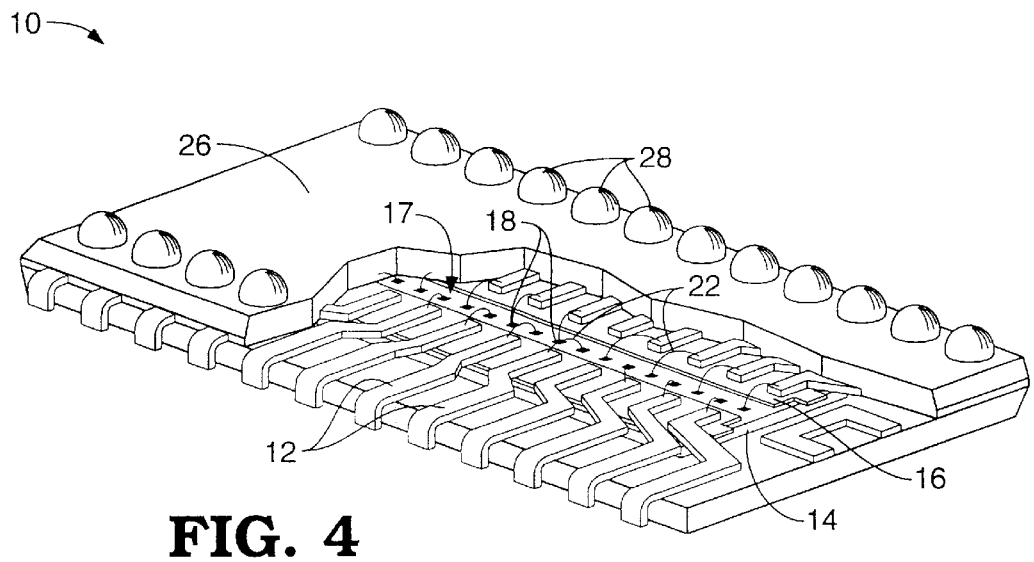
FIG. 4 is a perspective view of the embodiment of FIG. 1 wherein part of the encapsulating material has been cut away to show the upper surface of the semiconductor chip, the conductive leads and the solder balls.

FIG. 1 is a cross section view of a semiconductor chip package 10 constructed according to one of the preferred embodiments of the invention. FIG. 4 is a perspective view of the chip package of FIG. 1 wherein part of the encapsulating material has been removed. Referring to FIGS. 1 and 4, conductive leads 12, which comprise the inner portion of a conventional lead frame (not shown), are attached to a semiconductor chip 14 by a layer of adhesive material 16. Bond pads 18 are aligned along the central portion 20 of semiconductor chip 14. Bond pads 18 represent any of the various terminals commonly formed near the surface of a semiconductor chip through which electrical connections are made between active devices in the chip and external circuits.

The configuration of the chip package illustrated in FIGS. 1 and 4 is commonly referred to as a "lead over chip" (LOC) package because the conductive leads 12 extend over the semiconductor chip 14 and are bonded to the centrally located bond pads 18. Bond wires 22 connect conductive leads 12 to bond pads 18. The semiconductor chip assembly, which includes chip 14, bond pads 18 and inner end 13 of conductive leads 12, is encapsulated within an encapsulating material 26. External electrodes 28 are connected to conductive leads 12 through openings 30 formed in encapsulating material 26. External electrodes 28 may be positioned at desired locations along conductive leads 12. The conductive leads 12 are typically plated with a thin layer of metal suitable for wire bonding, such as gold, silver or palladium/nickel, at wire bond area 32 to improve the strength and conductivity of the bond between conductive leads 12 and bond wires 22. Similarly, conductive leads 12 may be plated with a thin layer of metal suitable for the solder connection, usually gold, palladium/nickel, or tin, at electrode bond area 34 to improve the strength and conductivity of the bond between conductive leads 12 and external electrodes 28. In this embodiment, the outer end 15 of conductive leads 12 extends out from the encapsulating material to facilitate chip testing using equipment and techniques presently used to test conventional external lead plastic packages. The external leads may be sheared after testing to provide a more compact package as shown in FIG. 2.

Figure 2:
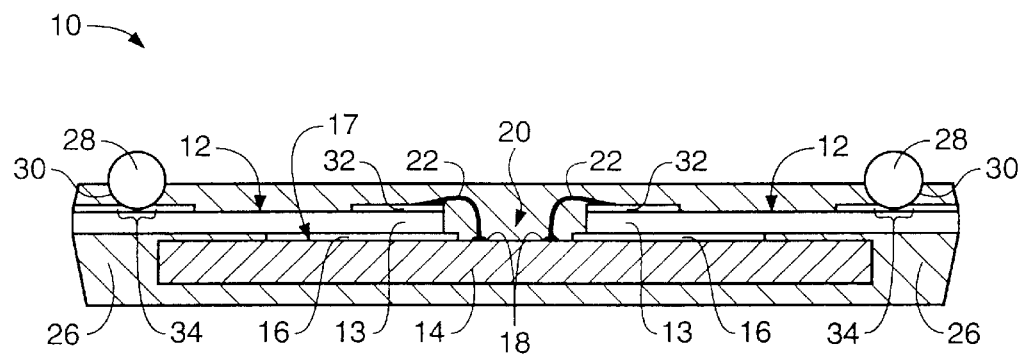
FIG. 2 is a cross section view of a second embodiment of the invention wherein the semiconductor chip is fully encapsulated and the conductive leads are positioned over the chip and severed flush with the edge of the encapsulating material.
Figure 3:
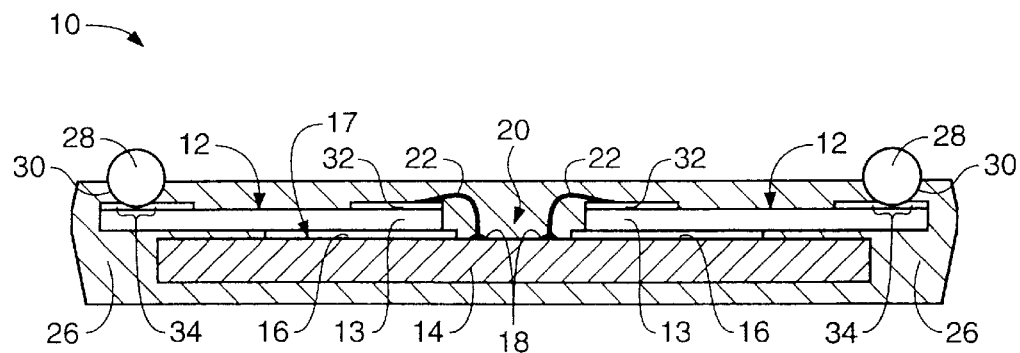
FIG. 3 is a cross section view of a third embodiment of the invention wherein the semiconductor chip and conductive leads are fully encapsulated.

In an alternative embodiment of the invention, shown in FIG. 2, the semiconductor chip 14 is fully encapsulated and the conductive leads sheared flush with the encapsulated material. This embodiment utilizes the same components as the preferred embodiment and results in a stronger but thicker package. In a third embodiment, illustrated in FIG. 3, the ends of the conductive leads 12 that would otherwise extend outside the encapsulating material are sheared prior to encapsulation so that the entire assembly is encapsulated.

Figure 5:
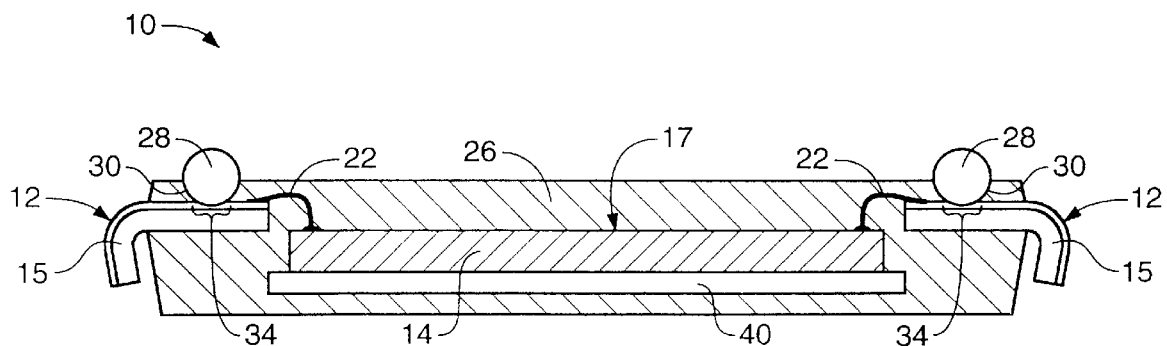
FIG. 5 is a cross section view of a fourth embodiment of the invention wherein the conductive leads are positioned adjacent to the semiconductor chip.

The invention may also be incorporated into a chip package wherein the bond pads are located along the periphery of the chip and wire bonded to adjacent leads. Referring to FIG. 5, semiconductor chip 14 is mounted on leadframe die paddle 40. Conductive leads 12 are wire bonded to bond pads 18 which are located along the periphery of chip 14. External electrodes 28 are connected to conductive leads 12 through openings 30 formed in encapsulating material 26.

The semiconductor chip package of the present invention can be formed using conventional molded plastic package lead frame assemblies and packaging processes and equipment. The invention is also advantageous over BGA and chip scale type packages because the electrode array can be configured and the package sized independent of the size of the semiconductor chip. The electrodes are connected to the conductive leads, not directly to the bond pads or wiring traces in the semiconductor chip as in known packages. Thus, the configuration of the electrodes as well as the size of the package can remain unchanged even as the chip size is reduced. Overall package dimensions can be controlled independent of chip size as necessary to accommodate standardized user requirements. Packaging equipment and processes need not be modified each time a reduction in chip size is achieved.

Figure 6:
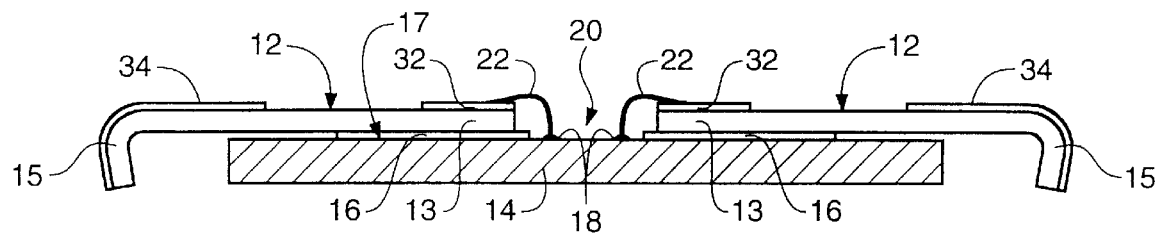
FIGS. 6–8 are cross section views of the embodiment of FIG. 1 at various stages of fabrication.

The fabrication of the package illustrated in FIGS. 1 and 4 will now be described with reference to FIGS. 6–8. Referring to FIG. 6, semiconductor chip 14, which can be any integrated circuit device, is attached to conductive leads 12. The active devices (not shown) within the chip are connected to centrally located bond pads 18. Generally, bond pads 18 are exposed through apertures in an insulating or passivation layer which forms the top surface of the chip. Conductive leads 12, which comprise the inner portion of a conventional lead frame (not shown), are positioned over the chip and extend to near the bond pads 18. Conductive leads 12 are attached the upper surface 17 of chip 14 by an adhesive layer 16 using conventional processes known in the art. For example, one known process for attaching a semiconductor chip to LOC leads is disclosed in U.S. Pat. No. 5,286,679, issued to Farnworth et al. on Feb. 15, 1994, incorporated herein by reference. Conductive leads 12 are usually prefabricated with plating of a thin layer of suitable metal at wire and electrode bond areas 32 and 34. Alternatively, conductive leads 12 may be plated after encapsulation and deflash (discussed below). Bond wires 22 are bonded to the bond pads 18 and the wire bond area 32 of the conductive leads 12 in a conventional manner well known in the art.

Figure 7:
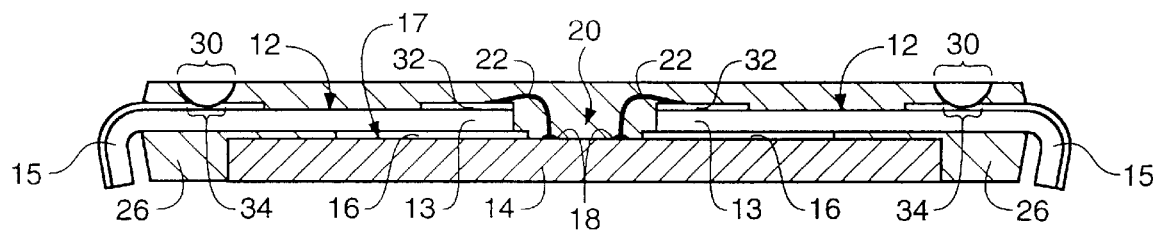

Referring to FIG. 7, the assembly is encapsulated within an encapsulating material 26, typically a thermosetting epoxy resin, in a conventional manner. The encapsulating material 26 is formed with openings 30 to expose conductive leads 12 at electrode bond area 34. Openings 30 are sized and shaped according to the size and shape of solder balls 38, which form the external electrodes. Openings 30 are shown hemispherically shaped to correspond to a spherical solder ball. It is to be understood, however, that openings 30 could be any size and shape that corresponds to the desired size and shape of the external electrode. Any resin residue that is present on the electrode bond area after encapsulation is removed by electrolytic or mechanical deflash processes well known in the art.

Figure 8:
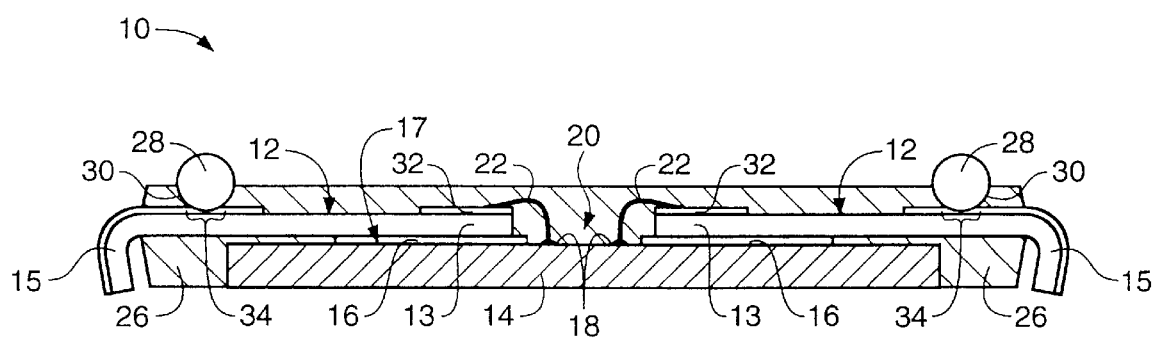

Referring to FIG. 8, solder balls 38 are bonded to electrode bond area 34 of conductive leads 12, which are exposed through openings 30. The solder balls may be attached, as is known in the art, by coating the solder balls or bond areas with flux, placing the balls on the electrode bond area 34 through opening 30 with conventional pick and place or shaker/hopper equipment, and reflowing the balls in place using an infrared or hot air reflow process. The excess flux is then removed with an appropriate cleaning agent. In this way, the solder balls are electrically and mechanically connected to the conductive leads to form the external electrodes. Other processes may also be used to form the external electrodes. For example, the electrodes may be "plated up" using conventional plating techniques rather than formed using solder balls as described above. The completed semiconductor chip package can then be assembled to a printed circuit board or the like using conventional surface mount processes and equipment.

There has been shown and described a novel semiconductor chip package that can be made only slightly larger than the chip using conventional leaded chip packaging processes and equipment and in which the array of bump electrodes can be sized and configured independent of the size of the chip. The particular embodiments shown in the drawings and described herein are for purposes of example and should not be construed to limit the invention as set forth in the appended claims. Those skilled in the art may now make numerous uses and modifications of the specific embodiments described without departing from the scope of the invention. The process steps described may in some instances be performed in a different order and/or equivalent structures and processes may be substituted for the various structures and processes described.

What is claimed is:

1. A method of making a semiconductor chip package, comprising:

electrically connecting a conductive lead to a semiconductor chip;

encapsulating at least a portion of the chip and at least a portion of the conductive lead in an encapsulating material;

forming an opening in the encapsulating material to expose an electrode bond area on the conductive lead;

forming an electrode in contact with the electrode bond area through the opening in the encapsulating material.

2. A method of making a semiconductor chip package, comprising:

electrically connecting a conductive lead to a semiconductor chip;

positioning the conductive lead over the chip;

encapsulating at least a portion of the chip and at least a portion of the conductive lead in an encapsulating material;

forming an opening in the encapsulating material to expose an electrode bond area on the conductive lead;

forming an electrode in contact with the electrode bond area through the opening in the encapsulating material.

3. A method of making a semiconductor chip package, comprising:

electrically connecting conductive leads to a semiconductor chip;

encapsulating the chip and the conductive leads in an encapsulating material;

forming openings in the encapsulating material to expose electrode bond areas on the conductive leads; and forming electrodes each in contact with a respective bond area through an associated opening in The encapsulating material.

4. A method of making a semiconductor chip package, comprising:

electrically connecting conductive leads To a semiconductor chip; positioning the conductive leads over the chip;

encapsulating at least a portion of the chip and at least a portion of the conductive leads in an encapsulating material;

forming openings in the encapsulating material to expose an electrode bond areas on the conductive leads; and forming electrodes in contact with the electrode bond areas through the openings in the encapsulating material.

5. A method of making a semiconductor chip package, comprising:

electrically connecting conductive leads to a semiconductor chip;

encapsulating the chip and the conductive leads in an encapsulating material;

forming openings in the encapsulating material to expose electrode bond areas on the conductive leads; and bonding solder balls to the conductive leads through the openings in the encapsulating material.

6. A method of forming a semiconductor chip package, comprising:

positioning a plurality of discrete conductive leads at spaced apart locations over a semiconductor chip;

electrically connecting the leads to the chip;

encapsulating the leads and the chip in encapsulating material; and forming electrode bumps that protrude from the encapsulating material and that extend through the encapsulating material to contact the leads.

7. A method of forming a semiconductor chip package, comprising:

forming an insulating layer over a surface of the chip;

forming holes in the insulating layer to expose bonding areas on the chip;

positioning a plurality of discrete conductive leads over the insulating layer;

attaching the conductive leads to the insulating layer;

electrically connecting the conductive leads to the bonding areas on the chip;

encapsulating the chip and at least a portion of the conductive leads over the chip in an encapsulating material;

forming openings in the encapsulating material; and bonding a plurality of solder balls to the bond areas on the chip through the openings in the encapsulating material.

8. A method according to claim 7, further comprising the step of severing the conductive leads flush with the encapsulating material.

* * * * *